US011944988B2

(12) United States Patent
Mustafa et al.

(10) Patent No.: US 11,944,988 B2
(45) Date of Patent: Apr. 2, 2024

(54) MULTI-ZONE SHOWERHEAD

(71) Applicant: APPLIED MATERIALS, INC., Santa Clara, CA (US)

(72) Inventors: Muhannad Mustafa, Santa Clara, CA (US); Muhammad Rasheed, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 681 days.

(21) Appl. No.: 16/415,665

(22) Filed: May 17, 2019

(65) Prior Publication Data
US 2019/0351433 A1 Nov. 21, 2019

Related U.S. Application Data

(60) Provisional application No. 62/673,286, filed on May 18, 2018.

(51) Int. Cl.
B05B 1/18 (2006.01)
B05B 7/08 (2006.01)
H01L 21/67 (2006.01)

(52) U.S. Cl.
CPC ............... B05B 1/18 (2013.01); B05B 7/08 (2013.01); H01L 21/67017 (2013.01)

(58) Field of Classification Search
None
See application file for complete search history.

(56) References Cited

U.S. PATENT DOCUMENTS

| | | | | |
|---|---|---|---|---|
| 6,403,491 B1 * | 6/2002 | Liu | ............... | H01L 21/76802 257/E21.507 |
| 7,740,706 B2 * | 6/2010 | Park | ............... | H01J 37/32449 156/345.33 |
| 8,764,902 B2 * | 7/2014 | Suzuki | ............... | C23C 16/45574 156/345.34 |
| 2002/0152960 A1 * | 10/2002 | Tanaka | ............... | C23C 16/45574 118/723 R |
| 2005/0109460 A1 * | 5/2005 | DeDontney | ....... | C23C 16/45565 156/345.33 |

(Continued)

FOREIGN PATENT DOCUMENTS

JP 2017157168 A * 9/2017
KR 101046097 B1 * 7/2011

Primary Examiner — Karla A Moore
(74) Attorney, Agent, or Firm — MOSER TABOA

(57) ABSTRACT

Embodiments of multi-zone showerheads are provided herein. In some embodiments, a multi-zone showerhead includes: a body having an outer surface and including a plurality of fluidly independent plenums; and a plurality of gas distribution plugs extending through the body, wherein at least one gas distribution plug includes a first internal gas passageway coupling a first plenum of the plurality of fluidly independent plenums to the outer surface and a second internal gas passageway coupling a second plenum of the plurality of fluidly independent plenums to the outer surface. In some embodiments, the body can include: a top plate; a bottom plate; and one or more intermediate plates disposed between the top plate and the bottom plate, wherein individual plenums of the plurality of fluidly independent plenums are respectively defined between adjacent plates of the top plate, the bottom plate, and the one or more intermediate plates.

1 Claim, 4 Drawing Sheets

(56) References Cited

U.S. PATENT DOCUMENTS

| | | | |
|---|---|---|---|
| 2009/0178615 A1* | 7/2009 | Kim | C23C 16/45574 |
| | | | 118/715 |
| 2013/0109159 A1 | 5/2013 | Carlson | |
| 2014/0026816 A1 | 1/2014 | Myo et al. | |
| 2014/0027060 A1 | 1/2014 | Ranish et al. | |
| 2015/0376784 A1* | 12/2015 | Wu | C23C 16/45508 |
| | | | 427/255.28 |
| 2016/0293431 A1* | 10/2016 | Sriraman | C23C 16/45561 |
| 2018/0374721 A1* | 12/2018 | Suzuki | H01L 21/205 |

* cited by examiner

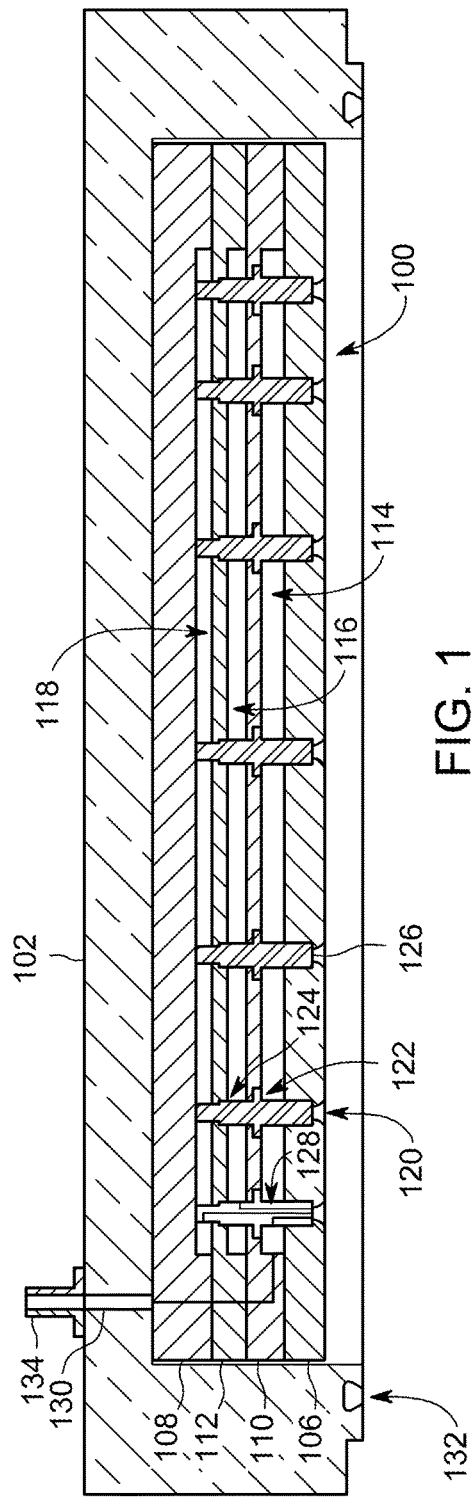
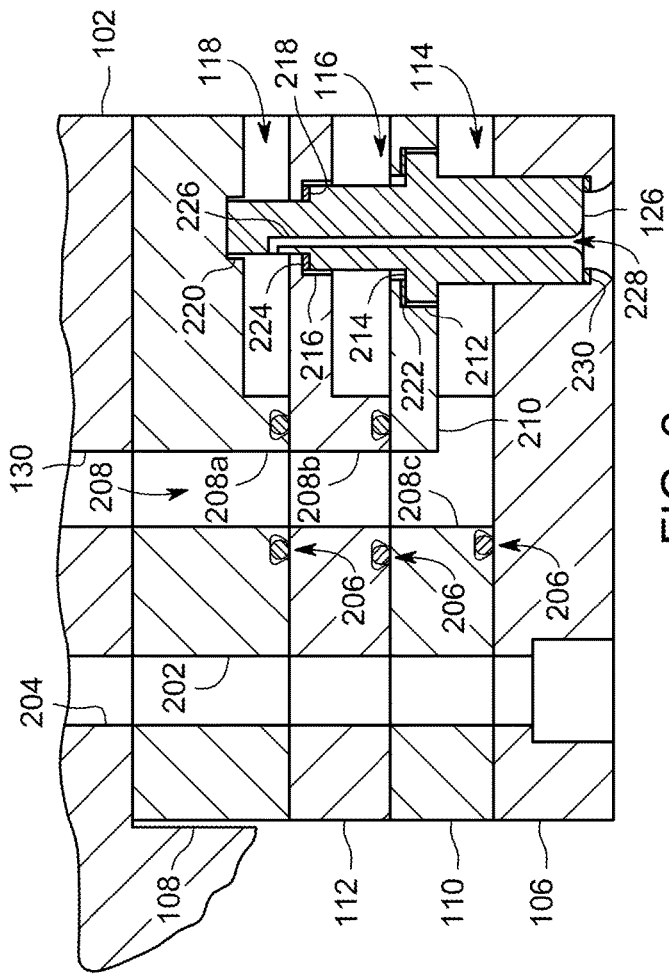
FIG. 1
FIG. 2

MULTI-ZONE SHOWERHEAD

CROSS-REFERENCE TO RELATED APPLICATIONS

This application claims benefit of U.S. provisional patent application Ser. No. 62/673,286, filed May 18, 2018 which is herein incorporated by reference in its entirety.

FIELD

Embodiments of the present disclosure generally relate to semiconductor processing equipment, and more particularly, to showerheads for use in such processing equipment.

BACKGROUND

Process chambers for processes often utilize showerheads to deliver gases to the processing volume of the process chamber. Typically, the showerhead is designed to maintain a uniform gas flow to the wafer. In some applications, the showerhead may be configured or designed to provide multiple different gases to the process chamber. For example, in a chemical vapor deposition (CVD) process, one or more gases may be provided to deposit a layer atop a substrate, such as a semiconductor wafer, disposed in the process chamber. The inventors have observed that in certain applications, the gases required for the process may prematurely mix within the showerhead, which can lead to defects, clogging of apertures, damage of parts, and the like. The inventors have observed that, in such applications, showerheads require aggressive purging to avoid mixing of the different gases before delivery to the process chamber for exposure to the substrate.

Therefore, the inventors have provided embodiments of improved showerheads.

SUMMARY

Embodiments of multi-zone showerheads are provided herein. In some embodiments, a multi-zone showerhead includes: a body having an outer surface and including a plurality of fluidly independent plenums; and a plurality of gas distribution plugs extending through the body, wherein at least one gas distribution plug includes a first internal gas passageway coupling a first plenum of the plurality of fluidly independent plenums to the outer surface and a second internal gas passageway coupling a second plenum of the plurality of fluidly independent plenums to the outer surface. In some embodiments, the body can include: a top plate; a bottom plate; and one or more intermediate plates disposed between the top plate and the bottom plate, wherein individual plenums of the plurality of fluidly independent plenums are respectively defined between adjacent plates of the top plate, the bottom plate, and the one or more intermediate plates.

In some embodiments, a multi-zone showerhead includes: a body including a top plate, a bottom plate, and one or more intermediate plates disposed between the top plate and the bottom plate; a plurality of fluidly independent plenums respectively defined between adjacent plates of the top plate, the bottom plate, and the one or more intermediate plates; a plurality of holes formed through the bottom plate and the one or more intermediate plates, wherein each hole in the bottom plate is aligned with corresponding holes in the one or more intermediate plates; and a plurality of gas distribution plugs, each gas distribution plug disposed in a corresponding hole of the plurality of holes formed through the bottom plate and extending through the corresponding holes of the one or more intermediate plates, wherein the gas distribution plugs include a first internal gas passageway coupling a first plenum of the plurality of fluidly independent plenums to an outer surface of the body and a second internal gas passageway coupling a second plenum of the plurality of fluidly independent plenums to the outer surface of the body.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 1 is a schematic cross-sectional side view of a multi-zone showerhead in accordance with at least some embodiments of the present disclosure.

FIG. 2 is an enlarged partial view of a multi-zone showerhead in accordance with at least some embodiments of the present disclosure.

Figure 3:
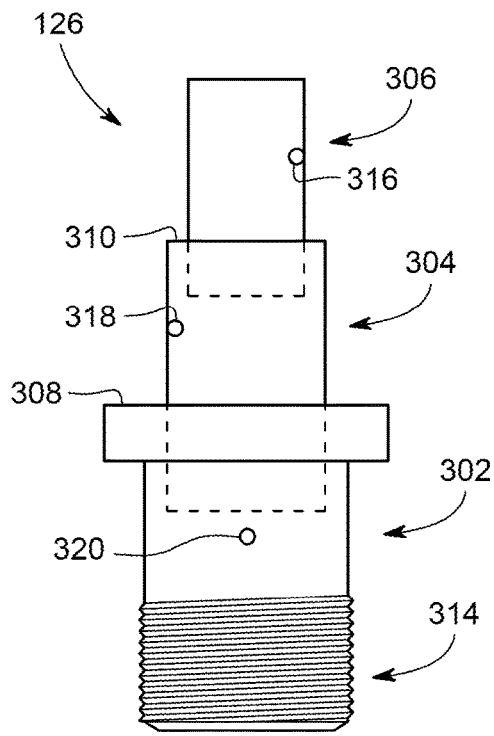
FIG. 3 is a schematic side view of a gas distribution plug for a multi-zone showerhead in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of multi-zone showerheads are provided herein. Embodiments of the multi-zone showerhead advantageously flow n number of gases from separate zones within the showerhead, thus avoiding the risk of mixing gases. Embodiments of the multi-zone showerhead are advantageously easily reconfigurable, enabling change in the number of separate zones without any major change in the showerhead design.

Multiple faceplates are stacked up using plugs as spacers to create multiple zones between each pair of faceplates. Each plug contains multiple independent channels for gas delivery from each zone. The plugs include support surfaces to install/support gaskets/O-rings that minimize or prevent leakage from one zone to another zone. The number of support surfaces and the length of each plug depends on the number of zones in the showerhead, for example, as needed for a particular process. The showerhead can be easily assembled and also easily dismantled during post and pre-cleaning for preventive maintenance. The number of zones can be changed without any major change of the showerhead design. The showerhead design is compact, thus saving space for the chamber lid.

For example, FIG. 1 is a schematic cross-sectional side view of a multi-zone showerhead 100 in accordance with at least some embodiments of the present disclosure. As shown in FIG. 1, the multi-zone showerhead 100 can be disposed in, or coupled to, a lid 102 of a process chamber, such as a substrate processing chamber configured for chemical vapor deposition (CVD), atomic layer deposition (ALD) or the like. The multi-zone showerhead 100 can be used in any processing system where separation of independent gas zones is desired.

Figure 6:
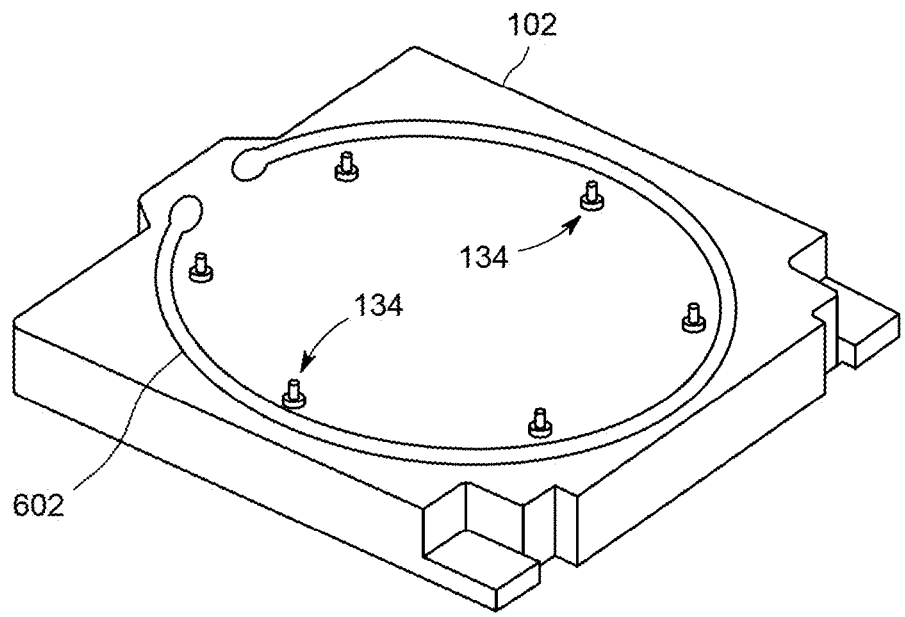
FIG. 6 is a top isometric view of lid of a process chamber having a multi-zone showerhead in accordance with at least some embodiments of the present disclosure.

The lid 102 is generally configured to be coupled to a process chamber for the processing of substrates, such as semiconductor substrates (e.g., wafers) or the like. The lid 102 can include a groove 132 to retain a sealing element, such as a gasket or o-ring, to facilitate forming a seal between a body of the process chamber and the lid 102. A plurality of conduits 130 are formed through the lid to couple a gas source to the multi-zone showerhead 100. A gas fitting 134 may be coupled to the lid at each conduit 130 to facilitate coupling to the gas source. Referring to FIG. 6, which depicts a top isometric view of the lid 102, one or more cooling channels 602 may be provided in the lid to maintain a desired temperature of the multi-zone showerhead 100.

Returning to FIG. 1, the multi-zone showerhead 100 generally includes a body having an outer surface and including a plurality of fluidly independent plenums disposed within the body. The fluidly independent plenums can advantageously be coupled to different independent gas sources to provide different gases or gaseous mixtures through the multi-zone showerhead 100 without coming into contact with each other within the multi-zone showerhead 100. In some embodiments, the body may be a generally planar structure having a circular or other cross section. In some embodiments, the body includes a top plate 108, a bottom plate 106, and one or more intermediate plates (two intermediate plates 110, 112 shown in FIG. 1) disposed between the top plate 108 and the bottom plate 106. The terms top and bottom are used herein with reference to the orientation of the drawings and are not meant to be limiting of the disclosure. For example, the multi-zone showerhead 100 may be used in other orientations.

Individual plenums of the plurality of fluidly independent plenums are respectively defined between pairs of adjacent plates of the top plate 108, the bottom plate 106, and the one or more intermediate plates (e.g., intermediate plates 110, 112). For example, in embodiments consistent with FIG. 1, a first plenum 114 is defined between the bottom plate 106 and the intermediate plate 110. A second plenum 116 is defined between the intermediate plate 110 and the intermediate plate 112. A third plenum 118 is defined between the intermediate plate 112 and the top plate 108. Greater or fewer fluidly independent plenums may be provided in the body, for example, by providing greater or fewer intermediate plates.

In some embodiments, each plenum can be defined by a recess formed in one side of the respective plate (e.g., the top plate 108 and the one or more intermediate plates, such as intermediate plates 110, 112). Alternatively, or in combination, at least some of the plenums can be defined by a recess formed in facing sides of respective adjacent plates. Alternatively, or in combination, at least some of the plenums can be defined by providing a peripheral spacer between respective adjacent plates to define the plenums between the opposing sides of the plates and the sidewalls of the spacer.

A plurality of gas distribution plugs 126 extend through the body. For example, gas distribution plugs 126 may be disposed in or through respective openings formed in the bottom plate 106 and the one or more intermediate plates (e.g., intermediate plates 110, 112). As depicted in FIG. 1, gas distribution plugs 126 are disposed in openings 120 formed in the bottom plate 106 and extend upward through corresponding openings 122 formed through intermediate plate 110 and openings 124 formed through intermediate plate 112.

The gas distribution plugs 126 provide fluidly independent gas passageways from the plurality of fluidly independent plenums to the outer surface of the body, such as to a processing volume or substrate facing side of the body. At least one gas distribution plug 126 includes a plurality of fluidly independent gas passageways 128 that couple each of the plurality of fluidly independent plenums to the outer surface of the body. For example, a first internal gas passageway couples a first plenum of the plurality of fluidly independent plenums to the outer surface and a second internal gas passageway couples a second plenum of the plurality of fluidly independent plenums to the outer surface. The number of internal gas passageways can vary dependent upon the number of independent plenums. For example, if a third plenum is provided, a third internal gas passageway can couple the third plenum of the plurality of fluidly independent plenums to the outer surface.

As depicted in FIG. 1, three fluidly independent gas passageways 128 are provided, one each coupling respective ones of the first plenum 114, the second plenum 116, and the third plenum 118 to the outer surface of the body through the openings 120 formed in the bottom plate 106. In some embodiments, a plurality of the gas distribution plugs 126 include the plurality of fluidly independent gas passageways 128 that couple each of the plurality of fluidly independent plenums to the outer surface of the body. In some embodiments, each of the plurality of the gas distribution plugs 126 include the plurality of fluidly independent gas passageways 128 that couple each of the plurality of fluidly independent plenums to the outer surface of the body.

Gases can be provided to each of the fluidly independent plenums of the multi-zone showerhead 100 by one or more gas inlets coupled to each of the fluidly independent plenums. For example, at least one gas inlet may be formed through the body for each plenum to couple the plenum to a respective gas source. As depicted in FIG. 1, a conduit 130 is formed through the lid 102 and is coupled the first plenum 114 via the at least one gas inlet of the body. A gas fitting 134 can be provided to facilitate coupling the conduit 130 to a gas source. Similarly, the lid 102 includes additional conduits and gas fittings that are coupled the second and third plenums 116, 118 via corresponding gas inlets formed in the body.

For example, as depicted in FIG. 2, a gas inlet 208 is formed through the body to the first plenum 114. The gas inlet 208 includes a first portion 208a formed through the top plate 108, a second portion 208b formed through the intermediate plate 112, and a third portion 208c through the intermediate plate 110. The third portion 208c of the gas inlet 208 is coupled to the first plenum 114 via an opening 210 extending from the third portion 208c to the first plenum 114.

Figure 8:
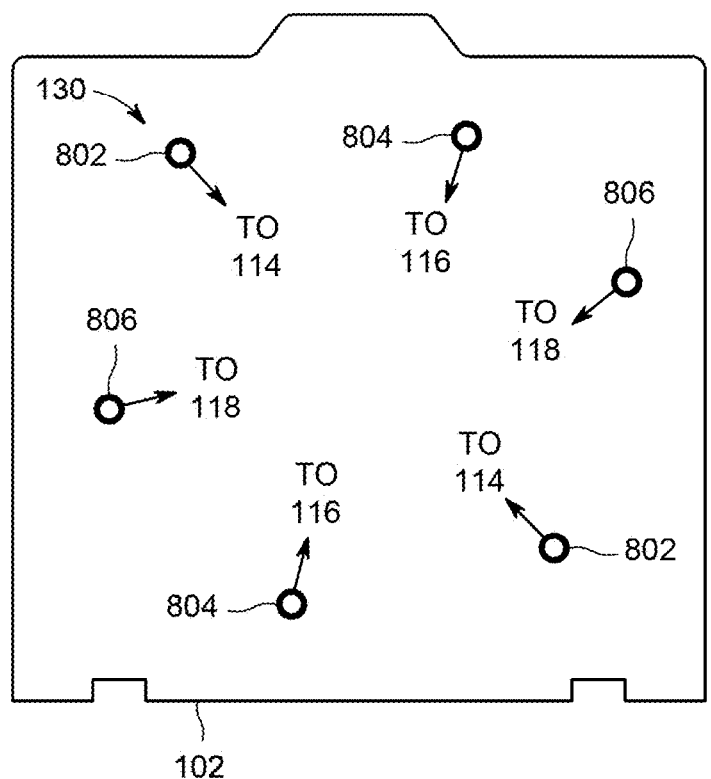
FIG. 8 is a top schematic view of lid of a process chamber having a multi-zone showerhead in accordance with at least some embodiments of the present disclosure.

Each plenum includes at least one gas inlet (e.g., gas inlet 208). The number of gas inlets to each plenum can be the same or different. For example, as depicted in FIG. 8, six conduits 130 are formed through the lid 102. The conduits are arranged in pairs, with two conduits 130 each coupled to a different of three plenums of the multi-zone showerhead via corresponding gas inlets. For example, conduits 802 are coupled to the first plenum 114, conduits 804 are coupled to the second plenum 116, and conduits 806 are coupled to the third plenum 118. Greater or fewer conduits may be provided (e.g., at least one per plenum) and greater or fewer plenums may be provided (e.g., at least two plenums). As depicted in FIG. 6, a corresponding plurality of gas fittings (e.g., six) are provided to couple different gas sources to the various independent plenums of the multi-zone showerhead 100.

Figure 9:
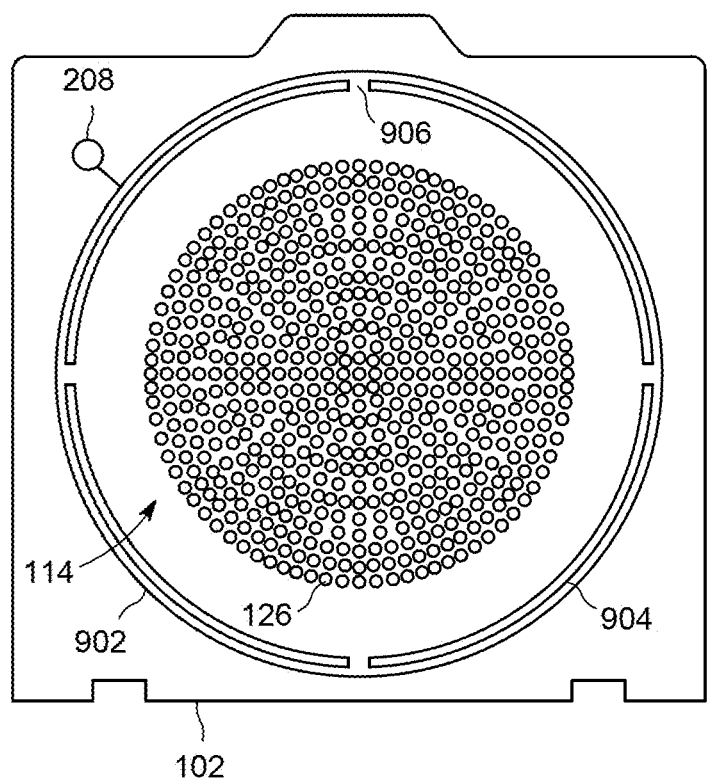
FIG. 9 is a top schematic cross-sectional view of lid of a process chamber having a multi-zone showerhead in accordance with at least some embodiments of the present disclosure.

In some embodiments, the plenums and respective one or more gas inlets can be configured to more uniformly distribute gas from the one or more gas inlets to the plenum. For example, in some embodiments and as depicted in FIG. 9, a gas inlet 208 can be coupled to an annular channel 902 formed about a periphery of a particular plenum (first plenum 114 shown in FIG. 9). One or more openings 906 can couple the annular channel 902 to the plenum. For example, a wall 904 can be defined between the annular channel 902 and the plenum (e.g., the first plenum 114) and the openings 906 can be formed through the wall 904 to couple the annular channel 902 to the plenum. In some embodiments, a plurality of openings 906 are provided. Although four openings 906 are shown in FIG. 9, greater or fewer openings 906 can be provided. In some embodiments, the plurality of openings 906 can be equidistantly spaced from each other. The openings 906 can be smaller than the cross sectional area of the annular channel 902 to facilitate filling the annular channel 902 with the gas prior to the gas flowing into the plenum.

Returning to FIG. 2, the gas distribution plugs 126 can have features configured to interface with corresponding or mating features of the body (e.g., of the various plates of the body) to provide one or more of mechanical rigidity, uniformity of plenum spacing, alignment of gas distribution plugs, or ease of assembly/disassembly. For example, as depicted in FIG. 2, the gas distribution plug 126 may include a radial flange 214 having a sealing surface (e.g., the top surface of the flange normal to the axis of the gas distribution plug 126). The radial flange 214 interfaces with a corresponding counterbore 212 formed in an opening through which the gas distribution plug 126 extends (e.g., the opening 122 of the intermediate plate 110 depicted in FIG. 2). Alternatively or in combination, the gas distribution plug 126 may include shoulder 218, for example, formed by adjacent axial portions of the gas distribution plug 126 having progressively smaller diameters in a direction toward the top of the gas distribution plug 126. The shoulder 218 provides a sealing surface. The shoulder 218 interfaces with a corresponding counterbore 216 formed in the opening through which the gas distribution plug 126 extends (e.g., the opening 124 of the intermediate plate 112 depicted in FIG. 2). A recess 220 may be provided in the top plate 108 to receive a top portion of the gas distribution plug 226.

Seals, such as o-rings, gaskets, or the like, can be provided as needed to limit or prevent any leakage of gases outside of the multi-zone showerhead 100 or between plenums of the plurality of fluidly independent plenums. For example, as depicted in FIG. 2, seals 206 can be provided around the openings of the gas inlet 208 portions (e.g., portions 208a, 208b, and 208c) between adjacent plates to limit or prevent leakage of gases between plenums.

In addition, seals can be provided between the gas distribution plugs 126 and one or more of the various plates of the body to limit or prevent any leakage of gases between plenums of the plurality of fluidly independent plenums. For example, as depicted in FIG. 2, a seal 230 may be provided in the opening 120 of the bottom plate 106, for example, between a bottom of the gas distribution plug 126 and an inner shelf of the opening 120, to minimize or prevent leakage between the first plenum 114 and the space outside of the multi-zone showerhead 100 (e.g., the process space or processing volume of a process chamber in which the showerhead is installed). A seal 222 may be provided between the radial flange 214 and the counterbore 212, for example, in the opening 122 of the intermediate plate 110, to minimize or prevent leakage between the first plenum 114 and the second plenum 116. A seal 224 may be provided between the shoulder 218 and the counterbore 216, for example, in the opening 124 of the intermediate plate 112, to minimize or prevent leakage between the second plenum 116 and the third plenum 118.

The various plates of the body (e.g., the top plate 108, bottom plate 106, and one or more intermediate plates, such as intermediate plates 110, 112 shown in FIGS. 1 and 2) can be secured together in any suitable manner, such as clamping, bolting, or the like. As depicted in FIG. 2, a plurality of openings 202 can be formed through the body to receive a bolt to clamp the plates of the multi-zone showerhead 100 together and to secure the multi-zone showerhead 100 to the lid 102. Corresponding threaded holes 204 can be formed in the lid 102 to receive the bolt. The openings 202 may include a counterbore to receive the head of the bolt so that the head is flush or recessed with respect to the lower face of the multi-zone showerhead 100 (e.g., the outer surface of the bottom plate 106).

FIG. 3 is a schematic side view of a gas distribution plug 126 for a multi-zone showerhead in accordance with at least some embodiments of the present disclosure. As depicted in FIG. 3, the gas distribution plug 126 include a plurality of portions corresponding to the number of plenums in the plurality of fluidly independent plenums of the multi-zone showerhead 100. In the embodiment depicted, three portions are shown: a first portion 302 (e.g., a bottom portion), a second portion 304 (e.g., a middle portion), and a third portion 306 (e.g., a top portion). A lowermost portion 314 of the first portion 302 is threaded to facilitate threading into the bottom plate (e.g., into openings 120 of the bottom plate 106 depicted in FIG. 1). A radial flange 308 is disposed between the first portion and the second portion to facilitate sealing between plenums. A shoulder 310 is disposed between the second portion 304 and the third portion 306 to facilitate sealing between plenums. In some embodiments and as indicated by dashed lines in FIG. 3, two or more of the different portions of the gas distribution plug 126 may be formed of separate components that can be assembled, such as by press fit or threading, to facilitate reconfiguration of the gas distribution plugs 126 to accommodate different numbers of plenums as needed for particular processes.

Figure 4:
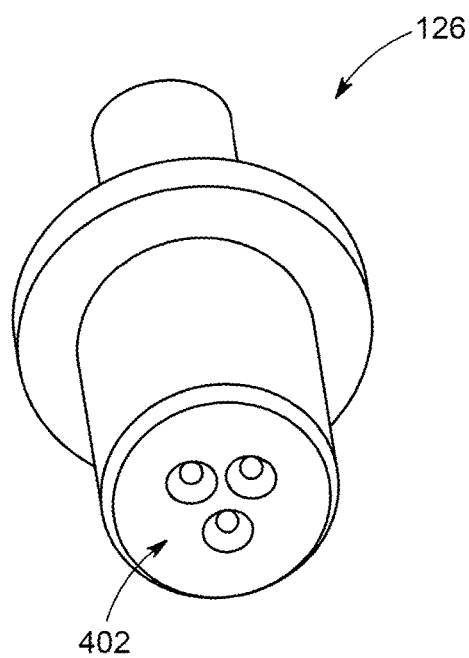
FIG. 4 is a bottom isometric view of a gas distribution plug for a multi-zone showerhead in accordance with at least some embodiments of the present disclosure.

The gas distribution plug 126 includes a plurality of fluidly independent gas passageways (e.g., gas passageways 128 discussed above) that extend between portions of the gas distribution plug 126 corresponding to respective plenums (e.g., the first, second, and third portions 302, 304, 306) and the bottom of the gas distribution plug 126. For example, as depicted in FIG. 3, a first opening 316 is shown in the third portion 306. Similarly, a second opening 318 is shown in the second portion 304. A third opening 320 is shown in the first portion 302. The first, second, and third openings 316, 318, 320 are openings of respective fluidly independent gas passageways extending through the gas distribution plug 126 to the bottom of the gas distribution plug 126. For example, as shown in FIG. 4, a plurality of openings 402 are disposed in the bottom of the gas distribution plug 126. The plurality of openings 402 correspond to the number of fluidly independent gas passageways of the gas distribution plug 126.

Figures 5A, 5B, 5C:
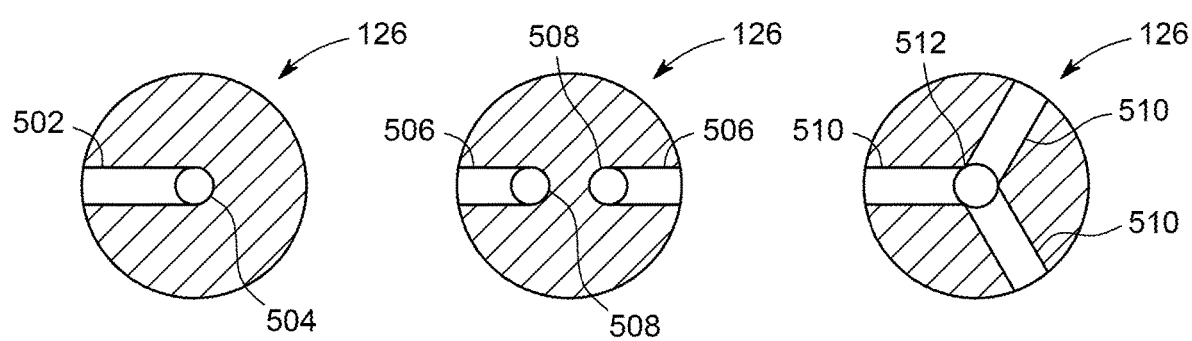
FIGS. 5A-5C are schematic cross-sectional top views of a gas distribution plug for a multi-zone showerhead in accordance with at least some embodiments of the present disclosure.

Each plenum of the plurality of fluidly independent plenums can be coupled through the gas distribution plugs 126 to the space below the gas distribution plug 126 and the bottom plate of the multi-zone showerhead 100 (e.g., bottom plate 106 discussed above). The plenums can be respectively coupled through single fluidly independent gas passageways of the gas distribution plugs 126, or through multiple fluidly independent gas passageways. For example, in some embodiments and as depicted in FIGS. 3, 4, and 5A, each plenum has a single corresponding fluidly independent gas passageway coupling the plenum to the space below the gas distribution plug. In other words, there is a single passageway from each opening in a portion of the gas distribution plug 126 corresponding to a particular plenum (e.g., 316, 318, 320 in FIG. 3) to the bottom of the gas distribution plug 126 (e.g., one of the openings 402). In some embodiments, at least one of the plenums up to and including all plenums, can have multiple fluidly independent gas passageways from the respective plenum to the bottom of the gas distribution plug 126. In such cases, the fluid independence refers to as between plenums and not as between gas passageways coupled to a given plenum.

For example, FIGS. 5A-5C are schematic cross-sectional top views of a gas distribution plug 126 for a multi-zone showerhead in accordance with at least some embodiments of the present disclosure. As depicted in FIG. 5A, a fluidly independent gas passageway can be formed of an axial portion 504 extending through the gas distribution plug 126 from the bottom of the gas distribution plug 126 and a radial portion 502 coupling the axial portion 504 to the outer surface of the particular portion of the gas distribution plug 126 (e.g., the radial portion 502 can terminate at one of openings 316, 318, 320).

Alternatively or in combination, and as depicted in FIG. 5B, a plurality of fluidly independent gas passageway can be formed of independent axial portions 508 extending through the gas distribution plug 126 from the bottom of the gas distribution plug 126. Corresponding independent radial portions 506 couple the axial portions 508 to the outer surface of the particular portion of the gas distribution plug 126. In such embodiments, two openings will be provided in each portion of the gas distribution plug 126 (e.g., two openings 316, two openings 318, and/or two openings 320).

Alternatively or in combination, and as depicted in FIG. 5C, a plurality of fluidly independent gas passageway can be formed of a single axial portion 512 extending through the gas distribution plug 126 from the bottom of the gas distribution plug 126. A plurality of radial portions 510 couple the axial portion 512 to the outer surface of the particular portion of the gas distribution plug 126 (three radial portions 510 depicted in FIG. 5C). In such embodiments, a corresponding plurality of openings will be provided in each portion of the gas distribution plug 126 (e.g., multiple openings 316, multiple openings 318, and/or multiple openings 320).

Figure 7:
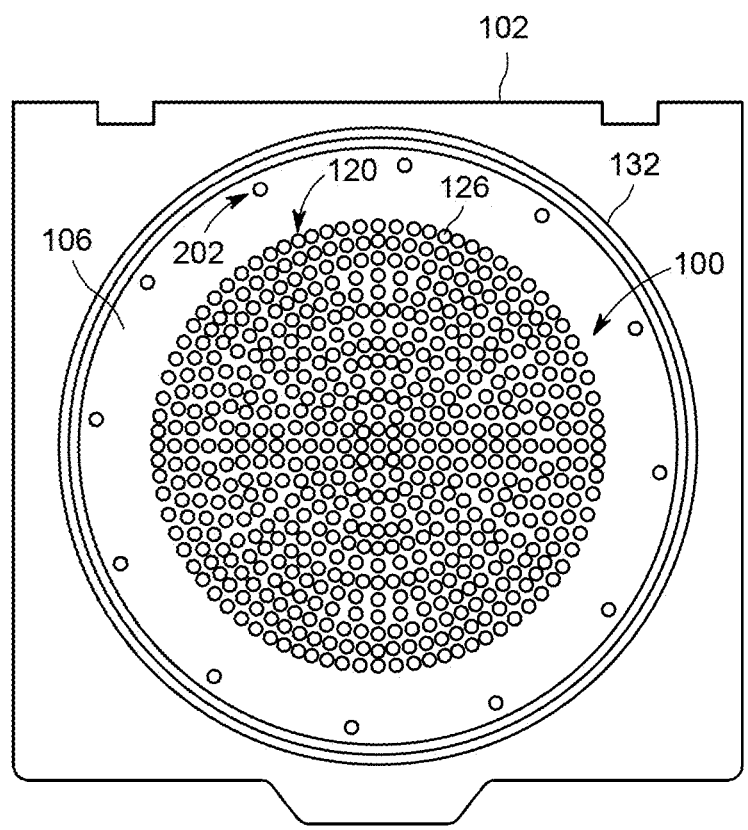
FIG. 7 is a bottom view of a lid of a process chamber having a multi-zone showerhead in accordance with at least some embodiments of the present disclosure.

The number and arrangement of the gas distribution plugs 126 can be configured to provide a desired flow pattern of the gases provided through the plenums to the process space below the multi-zone showerhead 100. For example, FIG. 7 depicts is a bottom view of a lid 102 of a process chamber having a multi-zone showerhead 100 in accordance with at least some embodiments of the present disclosure. As can be seen from the bottom view of FIG. 7, the openings 120 of the bottom plate 106 can be arranged in a uniform circular pattern and each opening includes a gas distribution plug 126. Other configurations are possible including varying the location and relative density (e.g., spacing) of the gas distribution plugs 126 to achieve a desired distribution of gas from the multi-zone showerhead 100. Alternatively or in combination, the number and size of the independent gas passageways can be different within a given gas distribution plug 126 or as between different gas distribution plugs 126 to provide different amounts of gas from different plenums and/or from different regions (e.g., center, middle, or edge regions) of the multi-zone showerhead 100.

While the foregoing is directed to embodiments of the present disclosure, other and further embodiments of the disclosure may be devised without departing from the basic scope thereof.

The invention claimed is:
1. A multi-zone showerhead, comprising:
a showerhead body including a top plate, a bottom plate, and two intermediate plates disposed between the top plate and the bottom plate;
a plurality of fluidly independent plenums including a first plenum defined between the top plate and a first intermediate plate of the two intermediate plates, a second plenum defined between the first intermediate plate and a second intermediate plate of the two intermediate plates, and a third plenum defined between the second intermediate plate and the bottom plate;
a plurality of holes formed through the bottom plate and the two intermediate plates, wherein each hole in the bottom plate is aligned with corresponding holes in the two intermediate plates; and
a plurality of gas distribution plugs, each gas distribution plug disposed in a corresponding hole of the plurality of holes formed through the bottom plate and extending through the corresponding holes of the two intermediate plates, wherein at least one gas distribution plug comprises a plug body that includes a first internal gas passageway coupling the first plenum to an outer surface of the showerhead body, a second internal gas passageway coupling the second plenum to the outer surface of the showerhead body, and a third internal gas passageway coupling the third plenum to the outer surface of the showerhead body,
wherein at least one gas distribution plug body comprises:
a bottom portion, a middle portion, and a top portion, wherein a lowermost portion of the bottom portion is threaded to facilitate threading into the bottom plate;

a radial flange disposed between the bottom portion and the middle portion to facilitate sealing between the third plenum and the second plenum; and a shoulder disposed between the middle portion and the top portion to facilitate sealing between the second plenum and the first plenum.

\* \* \* \* \*